(12) United States Patent
Pu et al.

(10) Patent No.: US 11,489,104 B2
(45) Date of Patent: Nov. 1, 2022

(54) ELECTROMAGNETIC-PIEZOELECTRIC COMPOSITE VIBRATION CONTROL DEVICE BASED ON SYNCHRONIZED SWITCH DAMPING TECHNOLOGY

(71) Applicant: Shanghai University, Shanghai (CN)

(72) Inventors: Huayan Pu, Shanghai (CN); Dong Zhang, Shanghai (CN); Min Wang, Shanghai (CN); Jun Luo, Shanghai (CN); Yi Sun, Shanghai (CN); Chaoqun Duan, Shanghai (CN); Shunqi Zhang, Shanghai (CN); Yan Peng, Shanghai (CN); Shaorong Xie, Shanghai (CN)

(73) Assignee: Shanghai University, Shanghai (CN)

( * ) Notice: Subject to any disclaimer, the term of this patent is extended or adjusted under 35 U.S.C. 154(b) by 421 days.

(21) Appl. No.: 16/683,478

(22) Filed: Nov. 14, 2019

(65) Prior Publication Data

US 2021/0091296 A1    Mar. 25, 2021

(30) Foreign Application Priority Data

Sep. 23, 2019   (CN) .......................... 201910898079.7

(51) Int. Cl.
*H01L 41/09* (2006.01)
*F16F 15/00* (2006.01)
*H01L 41/053* (2006.01)

(52) U.S. Cl.
CPC .......... *H01L 41/096* (2013.01); *F16F 15/005* (2013.01); *H01L 41/0536* (2013.01)

(58) Field of Classification Search
CPC ... H01L 41/096; H01L 41/0536; F16F 15/005
USPC ........................................................ 310/311
See application file for complete search history.

(56) References Cited

U.S. PATENT DOCUMENTS

| 2007/0050139 A1* | 3/2007 | Sidman | ................. | F16M 11/18 |
| | | | | 318/649 |
| 2013/0201316 A1* | 8/2013 | Binder | .................... | H04L 67/12 |
| | | | | 701/2 |
| 2018/0233856 A1* | 8/2018 | Brandwijk | ........... | A63H 33/042 |

* cited by examiner

*Primary Examiner* — Emily P Pham
*Assistant Examiner* — Monica Mata
(74) *Attorney, Agent, or Firm* — IP Attorneys Group, LLC

(57) ABSTRACT

An electromagnetic-piezoelectric composite vibration control device based on a synchronized switch damping technology is provided. An upper guiding component is installed inside the upper rigid frame, a lower guiding component is installed inside a lower rigid component, a guide rod is nested inside the upper guiding component and the lower guiding component, an upper idler wheel mechanism and a lower idler wheel mechanism are fixedly sleeved on the guide rod and are positioned between the upper guiding component and the lower guiding component respectively, an electromagnetic mechanism is fixedly sleeved outside the guide rod, one end of each piezoelectric cantilever beam is fixed between the upper rigid frame and the lower rigid frame, the other end is arranged between the upper idler wheel mechanism and the lower idler wheel mechanism, and the piezoelectric cantilever beams and the electromagnetic mechanism are connected with a circuit system respectively.

8 Claims, 15 Drawing Sheets

ELECTROMAGNETIC-PIEZOELECTRIC COMPOSITE VIBRATION CONTROL DEVICE BASED ON SYNCHRONIZED SWITCH DAMPING TECHNOLOGY

TECHNICAL FIELD

The present invention relates to the technical field of vibration abatement, and in particular, to an electromagnetic-piezoelectric composite vibration control device based on a synchronized switch damping technology.

BACKGROUND

The application of piezoelectric materials in vibration control mainly includes three conditions such as passive control, active control and semi-active control. The passive control principle is that electric charges generated, in the structural vibration process, by the piezoelectric element are dissipated or absorbed through a series or parallel circuit externally by using the direct piezoelectric effect of the piezoelectric materials, and the system is simple but relatively low in control effect. Active control is a technology in virtue of implementation control of an external power supply in combination with modern control technology and inductive technology, the control effect is preferable, but the system is complex and huge, high in cost and low in reliability. Aiming at above technical defects, the semi-active control technology is developed as a new technology, and is widely researched.

A control method based on a non-linear synchronized switch damping technology is representative in piezoelectric vibration semi-active control, the method is also called as SSD (Synchronized Switch Damping) technology, and some simple electronic elements such as inductive elements and switches are serially connected in the circuit so that electric energy on the piezoelectric element is quickly dissipated or voltage overturning is realized, so that the purpose of vibration damping is reached. A synchronized switch damping on shortage (SSDS) technology, a synchronized switch damping on inductor (SSDI) technology and a synchronized switch damping on voltage (SSDV) technology are relatively classical semi-active vibration control methods based on the non-linear synchronized switch damping technology. In the methods, the control effect of the SSDV technology is mostly obvious, and complete vibration abatement can be realized theoretically. However, an external voltage source needs to be provided in the technology, simultaneously, the voltage amplitude needs a proportional relation with the maximum amplitude (without applying control) of system vibration if a preferable control effect needs to be reached, larger inductance elements further need to be introduced for regulating the circuit in order to reach the preferable effect, and the circuit system becomes huge and heavy, so that the method is difficult to apply in practice.

SUMMARY

In order to solve the technical problem, the present invention provides an electromagnetic-piezoelectric composite vibration control device based on a synchronized switch damping technology. The device is simple in structure and reliable in performance, a voltage source does not need to be provided externally, and the device is of an adaptive characteristic.

To achieve the above purpose, the present invention provides the following technical solutions.

The present invention provides an electromagnetic-piezoelectric composite vibration control device based on a synchronized switch damping technology, where the device includes a load platform, a guide rod, an upper rigid frame, a lower rigid frame, an upper guiding component, a lower guiding component, an upper idler wheel mechanism, a lower idler wheel mechanism, an elastic component, an electromagnetic mechanism, a circuit system and a plurality of piezoelectric cantilever beams, the upper rigid frame is arranged at the upper part of the lower rigid frame, the upper guiding component is installed inside the upper rigid frame, the lower guiding component is installed inside the lower rigid component, the guide rod is nested inside the upper guiding component and the lower guiding component, the load platform is fixed to the upper end of the guide rod, the upper idler wheel mechanism and the lower idler wheel mechanism are fixedly sleeved on the guide rod and are positioned between the upper guiding component and the lower guiding component respectively, the electromagnetic mechanism is fixedly sleeved outside the guide rod, the elastic component is sleeved outside the lower idler wheel mechanism, one end of each piezoelectric cantilever beam is fixed between the upper rigid frame and the lower rigid frame, the other end of each piezoelectric cantilever beam is arranged between the upper idler wheel mechanism and the lower idler wheel mechanism, and the piezoelectric cantilever beams and the electromagnetic mechanism are connected with the circuit system respectively.

Preferably, the device further includes a gasket, the gasket is sleeved on the guide rod, and the gasket is positioned between the lower guiding component and the lower elastic component.

Preferably, each piezoelectric cantilever beam includes a piezoelectric plate, a flexible plate and a rigid plate, one end of each flexible plate is fixed between the upper rigid frame and the lower rigid frame, the other end of each flexible plate is fixedly connected with the corresponding rigid plate, the rigid plates are arranged between the upper idler wheel mechanism and the lower idler wheel mechanism, and each piezoelectric plate is pasted onto the corresponding flexible plate.

Preferably, the upper idler wheel mechanism includes an upper idler wheel support, a plurality of upper wheel axles and a plurality of upper idler wheels, the upper idler wheel support includes an upper cylinder and a plurality of upper supports, the upper idler wheel support is of an integral structure, the upper cylinder is fixedly sleeved on the guide rod, one end of each upper support is arranged at the lower part of the upper cylinder, the corresponding upper wheel axle is installed at the other end of each upper support, the corresponding upper idler wheel is installed on each upper wheel axle, and each upper idler wheel is in contact with the upper surface of the corresponding rigid plate; the lower idler wheel mechanism includes a lower idler wheel support, a plurality of lower wheel axles and a plurality of lower idler wheels, the lower idler wheel support includes a lower cylinder and a plurality of lower supports, the lower idler wheel support is of an integral structure, the lower cylinder is fixedly sleeved on the guide rod, one end of each lower support is arranged at the upper part of the lower cylinder, the corresponding lower wheel axle is installed at the other end of each lower support, the corresponding lower idler wheel is installed on each lower wheel axle, and each lower idler wheel is in contact with the lower surface of the corresponding rigid plate.

Preferably, the electromagnetic mechanism includes a plastic fixed support, a locking ring, a permanent magnet and two coils, where the permanent magnet and the locking ring are arranged on the guide rod, the locking ring, the permanent magnet and the upper idler wheel support are arranged from top to bottom in sequence, the plastic fixed support is fixed on the upper rigid frame, the plastic fixed support is arranged outside the permanent magnet in a covering mode, and the two coils are sleeved outside the plastic fixed support respectively.

Preferably, the plastic fixed support is in the shape of a cylinder, a plurality of vertical sliding grooves are formed in the circumferential direction of the plastic fixed support, the coils are sleeved outside the plastic fixed support, and the coils are fixed onto the plastic fixed support by setting fixed bolts inside the vertical sliding grooves.

The present invention further provides an electromagnetic-piezoelectric composite vibration control device based on the synchronized switch damping technology, where a plurality of piezoelectric plates are connected in parallel to form a piezoelectric element, the two coils are connected in series to form an inductive element, the circuit system includes a regulating resistor, a super-capacitor, a first electronic switch, a second electronic switch and an inductive circuit, the inductive circuit is used for detecting the motion state of the system so that the on-off states of the first electronic switch and the second electronic switch are changed according to requirements, and when the inductive circuit detects that the load platform reaches a static balance position, a loop is formed by the inductive element and the super-capacitor by switching the on-off states of the first electronic switch and the second electronic switch; when the inductive circuit detects that the load platform reaches a vibration peak value, the piezoelectric element, the regulating resistor, the inductive element and the super-capacitor are connected in series in sequence to form a closed loop by switching the on-off states of the first electronic switch and the second electronic switch.

Preferably, the upper guiding component and the lower guiding component are linear bearings respectively.

Preferably, the upper elastic component is a reset spring.

Compared with the prior art, the present invention has the following technical effects:

The electromagnetic-piezoelectric composite vibration control device based on the synchronized switch damping technology provided by the present invention includes an electromagnetic mechanism, piezoelectric cantilever beams and a circuit system, due to the structural advantages of the device, the circuit system is greatly simplified, the reliability of the whole system is strengthened, even if the circuit system breaks down, due to the rigidity damping characteristic of the electromagnetic mechanism and the piezoelectric cantilever beams, a preferable damping effect also can be realized, and the circuit system is simple in structure and reliable in performance; the electromagnetic mechanism is used for storing electricity generated by electromagnetic induction into the circuit system to serve as a voltage source, and a voltage source does not need to be provided externally; the induced voltage generated by the electromagnetic mechanism is approximately of a proportional relation with the maximum amplitude of system vibration, and thus the system is of a self-adaptive voltage source characteristic.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

Figure 1:
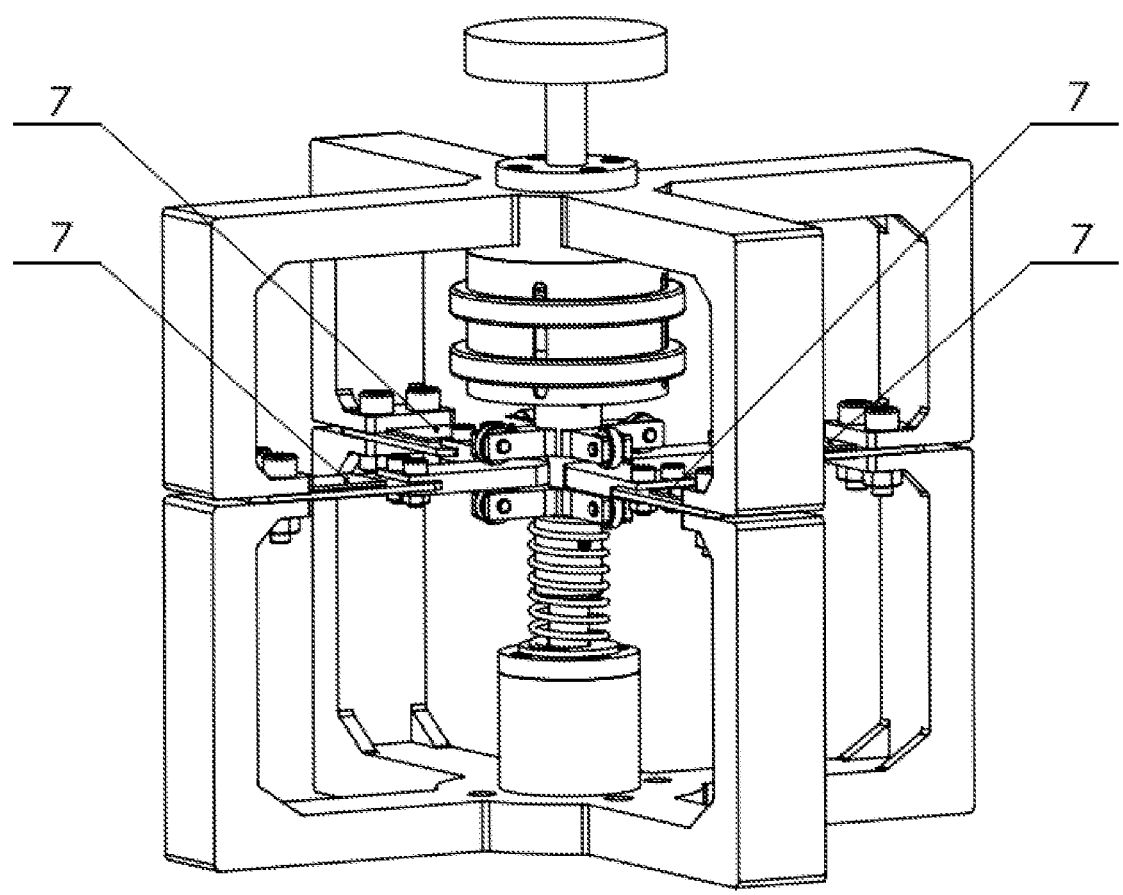
FIG. 1 is a stereoscopic structure schematic diagram of an electromagnetic-piezoelectric composite vibration control device based on a synchronized switch damping technology provided by the present invention.
Figure 2:
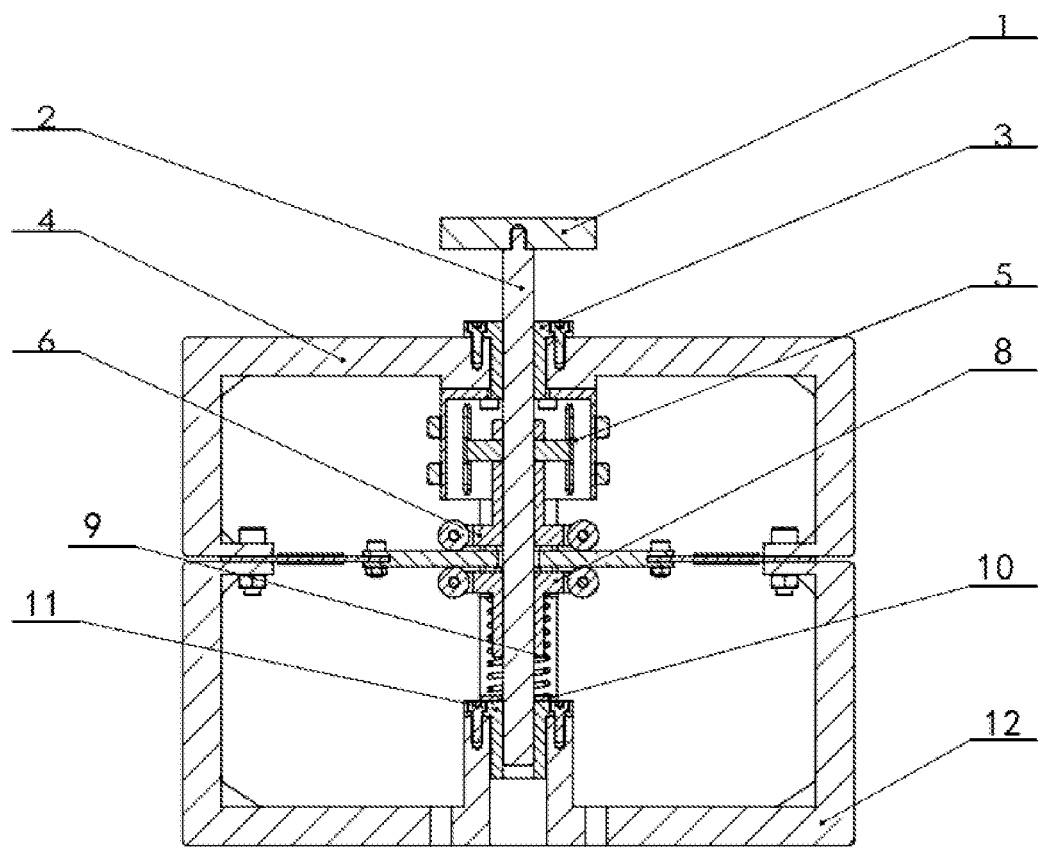
FIG. 2 is a section view of an electromagnetic-piezoelectric composite vibration control device based on the synchronized switch damping technology provided by the present invention.
Figure 3:
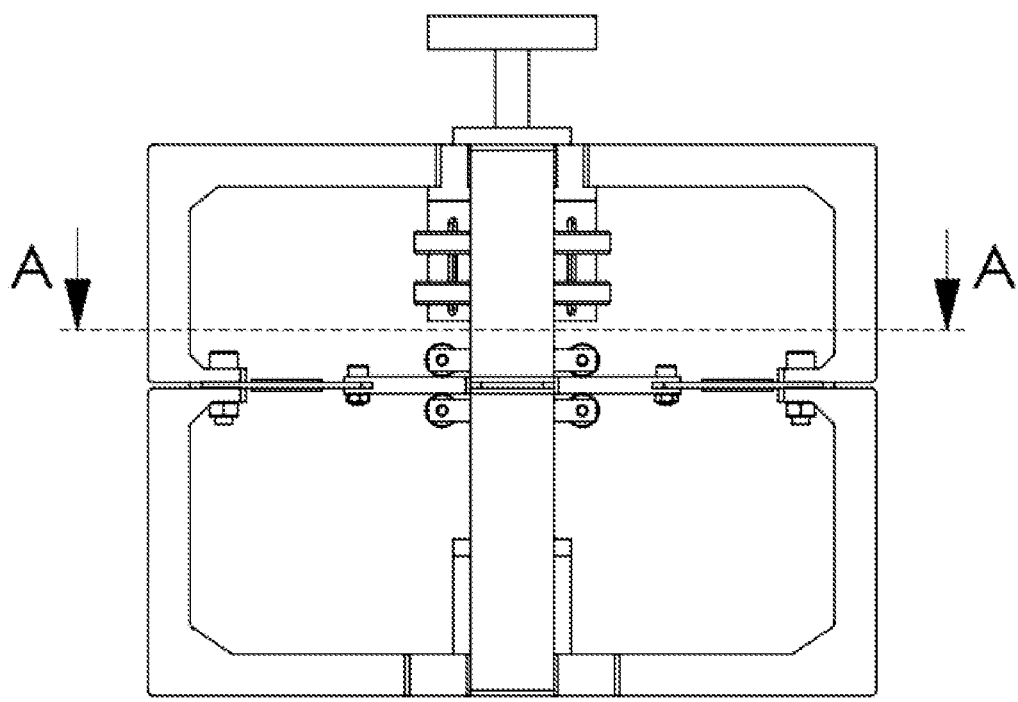
FIG. 3 is a front view of an electromagnetic-piezoelectric composite vibration control device based on the synchronized switch damping technology provided by the present invention.

Description of attached drawing marks: 1, load platform; 2, guide rod; 3, upper guiding component; 4, upper rigid frame; 5, electromagnetic mechanism; 51, plastic fixed support; 52, coil; 53, permanent magnet; 54, locking ring; 6, upper idler wheel mechanism; 61, upper idler wheel support; 7, piezoelectric cantilever beam; 71, flexible plate; 72, rigid plate; 73, piezoelectric plate; 8, lower idler wheel mechanism; 9, elastic component; 10, gasket; 11, lower guiding component; 12, lower rigid frame; 13, circuit system; 14, piezoelectric element; 15, inductive element; 16, super-capacitor; 17, regulating resistor; 18, inductive circuit; 19, first electronic switch; and 20, second electronic switch.

DETAILED DESCRIPTION

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

The present invention provides an electromagnetic-piezoelectric composite vibration control device based on a synchronized switch damping technology. The device is simple in structure and reliable in performance, a voltage source does not need to be provided externally, and the device is of an adaptive characteristic.

To make the foregoing objective, features, and advantages of the present invention clearer and more comprehensible, the present invention is further described in detail below with reference to the accompanying drawings and specific embodiments.

As shown in FIG. 1 to FIG. 6, the embodiment provides an electromagnetic-piezoelectric composite vibration control device based on a synchronized switch damping technology. The electromagnetic-piezoelectric composite vibration control device includes a load platform 1, a guide rod 2, an upper rigid frame 4, a lower rigid frame 12, an upper guiding component 3, a lower guiding component 11, an upper idler wheel mechanism 6, a lower idler wheel mechanism 8, an elastic component 9, an electromagnetic mechanism 5, a circuit system 13 and a plurality of piezoelectric cantilever beams 7, the upper rigid frame 4 is arranged at the upper part of the lower rigid frame 12, the upper guiding component 3 is installed inside the upper rigid frame 4, the lower guiding component 11 is installed inside the lower rigid component, specifically, the upper guiding component 3 is fixed onto the upper rigid frame 4 through screws, the lower guiding component 11 is fixed onto the lower rigid frame 12 through screws, the guide rod 2 is nested inside the upper guiding component 3 and the lower guiding component 11, the guide rod 2 is restricted by the upper guiding component 3 and the lower guiding component 11 so that the guide rod 1 can only perform a vertical motion, specifically, the upper guiding component 3 and the lower guiding component 11 are linear bearings respectively, the load platform 1 is fixed to the upper end of the guide rod 2, and specifically, the load platform 1 is in threaded connection with the guide rod 2; the upper idler wheel mechanism 6 and the lower idler wheel mechanism 8 are fixedly sleeved on the guide rod 2 and are positioned between the upper guiding component 3 and the lower guiding component 11 respectively, specifically, the upper idler wheel mechanism 6 and the lower idler wheel mechanism 8 are locked onto the guide rod 2 through stopper screws, the electromagnetic mechanism 5 is fixedly sleeved outside the guide rod 2, the elastic component 9 is sleeved outside the lower idler wheel mechanism 8, specifically, the elastic component 9 is a reset spring, one end of each piezoelectric cantilever beam 7 is fixed between the upper rigid frame 4 and the lower rigid frame 12, and the other end of each piezoelectric cantilever beam 7 is arranged between the upper idler wheel mechanism 6 and the lower idler wheel mechanism 8, so that the piezoelectric cantilever beams 7 are restricted to move in a single degree of freedom in the vertical direction, the wasted energy of flutter on other modes is reduced, and the piezoelectric cantilever beams 7 and the electromagnetic mechanism 5 are connected with the circuit system 13 respectively.

The electromagnetic-piezoelectric composite vibration control device in the embodiment further includes a gasket 10, the gasket 10 is sleeved on the guide rod 2, the gasket 10 is positioned between the lower guiding component 11 and the lower elastic component 9, and the piezoelectric cantilever beams 7 can always remain at a horizontal balance position in the static balance state of different loadings by adjusting the gasket 10.

Figure 4:
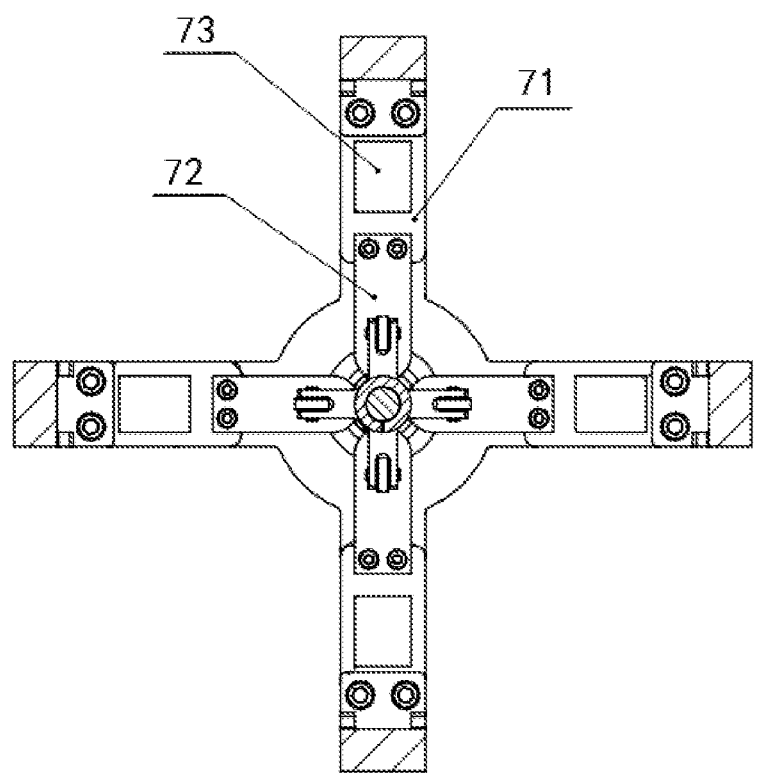
FIG. 4 is a section view in A-A direction in FIG. 3.

As shown in FIG. 4, each piezoelectric cantilever beam 7 includes a piezoelectric plate 73, a flexible plate 71 and a rigid plate 72, one end of each flexible plate 71 is fixed between the upper rigid frame 4 and the lower rigid frame 12, the other end of each flexible plate 71 is fixedly connected with the corresponding rigid plate 72, the rigid plates 72 are arranged between the upper idler wheel mechanism 6 and the lower idler wheel mechanism 8, and each piezoelectric plate 73 is pasted onto the corresponding flexible plate 71. Specifically, the upper rigid frame 4 and the lower rigid frame 12 are connected through bolts and the flexible plates 71 of the piezoelectric cantilever beams 7 are locked in the upper rigid frame 4 and the lower rigid frame 12, the rigid plate 72 of each piezoelectric cantilever beam 7 is connected with the corresponding flexible plate 71 through bolts, the rigid plates 72 are arranged between the upper idler wheel mechanism 6 and the lower idler wheel mechanism 8, and each piezoelectric plate 73 is pasted onto the corresponding flexible plate 71. In the specific embodiment, each piezoelectric cantilever beam 7 includes two piezoelectric plates 73, the two piezoelectric plates 73 are adhered to the upper surface and the lower surface of the corresponding flexible plate 71 respectively, the piezoelectric plates 73 are arranged at the position close to the clamping end and are symmetric about the neutral axis of the corresponding flexible plate 71, and specifically, a plurality of piezoelectric plates 73 further can be adhered according to requirements.

In the specific embodiment, four piezoelectric cantilever beams 7 are arranged and are uniformly distributed along the circumferential direction of the guide rod 2, namely, the four piezoelectric cantilever beams 7 are arranged symmetrically in pairs.

The upper idler wheel mechanism 6 includes an upper idler wheel support 61, a plurality of upper wheel axles and a plurality of upper idler wheels, the upper idler wheel support 61 includes an upper cylinder and a plurality of upper supports, the upper idler wheel support 61 is of an integral structure, the upper support, the upper wheel axles, the upper idler wheel and the rigid plates 72 are of a one-to-one corresponding relation, the upper cylinder is fixedly sleeved on the guide rod 2, specifically, axial fixation of the upper cylinder is realized through stopper screws, one end of each upper support is arranged at the lower part of the upper cylinder, the corresponding upper wheel axle is installed at the other end of each upper support, the corresponding upper idler wheel is installed on each upper wheel axle, and each upper idler wheel is in contact with the upper surface of the corresponding rigid plate 72; the lower idler wheel mechanism 8 includes a lower idler wheel support, a plurality of lower wheel axles and a plurality of lower idler wheels, the lower idler wheel support includes a lower cylinder and a plurality of lower supports, the lower idler wheel support is of an integral structure, the lower support, the lower wheel axles, the lower idler wheel and the rigid plates 72 are of a one-to-one corresponding relation, the lower cylinder is fixedly sleeved on the guide rod 2, specifically, axial fixation of the lower cylinder is realized through stopper screws, one end of each lower support is arranged at the upper part of the lower cylinder, the corresponding lower wheel axle is installed at the other end of each lower support, the corresponding lower idler wheel is installed on each lower wheel axle, and each lower idler wheel is in contact with the lower surface of the corresponding rigid plate 72.

Figure 5:
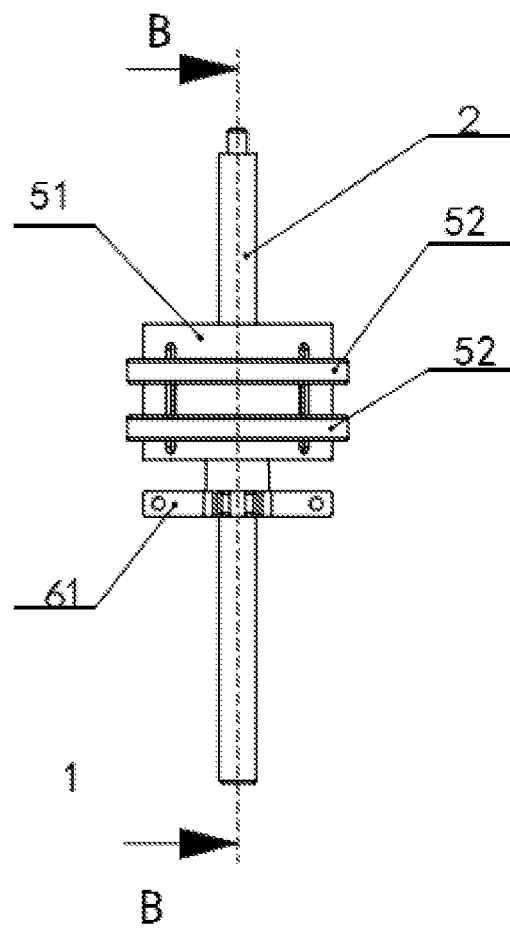
FIG. 5 is a structure diagram of an electromagnetic mechanism in the present invention.
Figure 6:
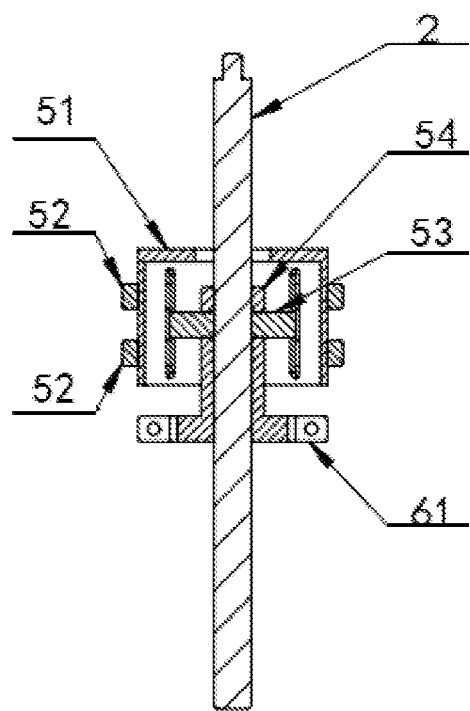
FIG. 6 is a section view in B-B direction in FIG. 5.

As shown in FIG. 5 and FIG. 6, the electromagnetic mechanism 5 includes a plastic fixed support 51, a locking ring 54, a permanent magnet 53 and two coils 52, the permanent magnet 53 and the locking ring 54 are sleeved on the guide rod 2, the locking ring 54, the permanent magnet 53 and the upper idler wheel support 61 are arranged from top to bottom in sequence, the permanent magnet 53 is locked onto the upper idler wheel support 61 by the locking ring 54, the plastic fixed support 51 is fixed onto the upper rigid frame 4, the plastic fixed support 51 is arranged outside the permanent magnet 53 in a covering mode, and the two coils 52 are sleeved outside the plastic fixed support 51 respectively. Ferroelectric materials can be prevented from generating interference on the magnetic field of the permanent magnet 53 by using the plastic fixed support.

The plastic fixed support 51 is in the shape of a cylinder, a plurality of vertical sliding grooves are formed in the circumferential direction of the plastic fixed support 51, the coils 52 are sleeved outside the plastic fixed support 51, and the coils 52 are fixed onto the plastic fixed support 51 by setting fixed bolts inside the vertical sliding grooves, so that when the device is statically balanced, the two coils 52 are symmetrically distributed along the permanent magnet 53 (as shown in FIG. 5), and the induced voltage generated by the coils 52 is the maximum at a balance position by adjusting the permanent magnet 53 of which the distribution distance meets a constant speed motion.

Figure 7:
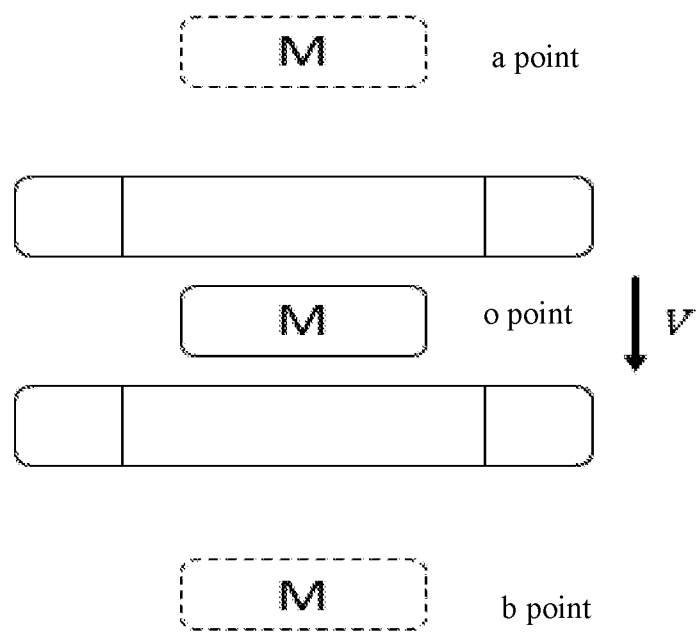
FIG. 7 is a schematic diagram of relative coil movement of the permanent magnet in the present invention.
Figure 8:
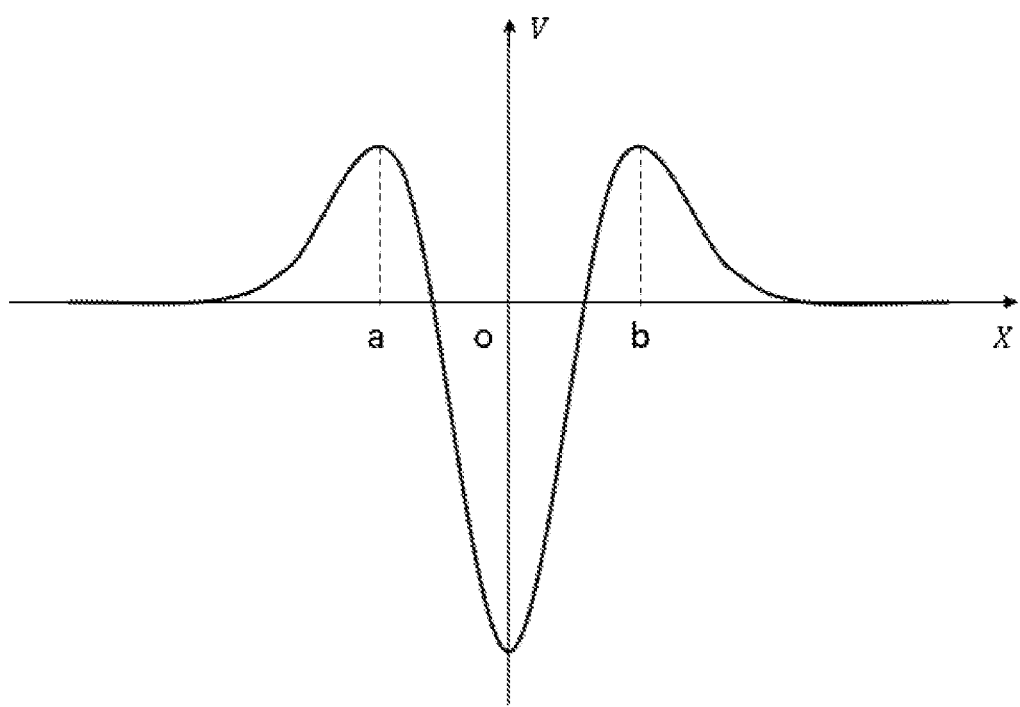
FIG. 8 is an induced voltage curve chart of the coils when the permanent magnet moves in FIG. 7.

As shown in FIG. 7 and FIG. 8, the figures are a configuration schematic diagram of the electromagnetic mechanism 5 and a trend curve graph of induced voltage generated when the corresponding permanent magnet 53 moves from the top of the upper coil 52 to the bottom of the lower coil 52 at a constant speed V. Here, the reason for adopting the configuration is that the kinetic energy of the vibration damper at the balance position in the vibration process is the maximum, namely the speed is the maximum, therefore, the maximum induced voltage of the permanent magnet 53 moving at the constant speed is also generated at the balance position if the induced voltage generated by the coils 52 is as high as possible, and when a single coil is adopted, the induced voltage generated at the balance position is zero. Moreover, the induced voltage generated at the balance position by adopting the configuration is approximately of a proportional relation with the maximum amplitude of system vibration, and thus a self-adaptive voltage source can be provided for piezoelectric vibration control.

Figure 9:
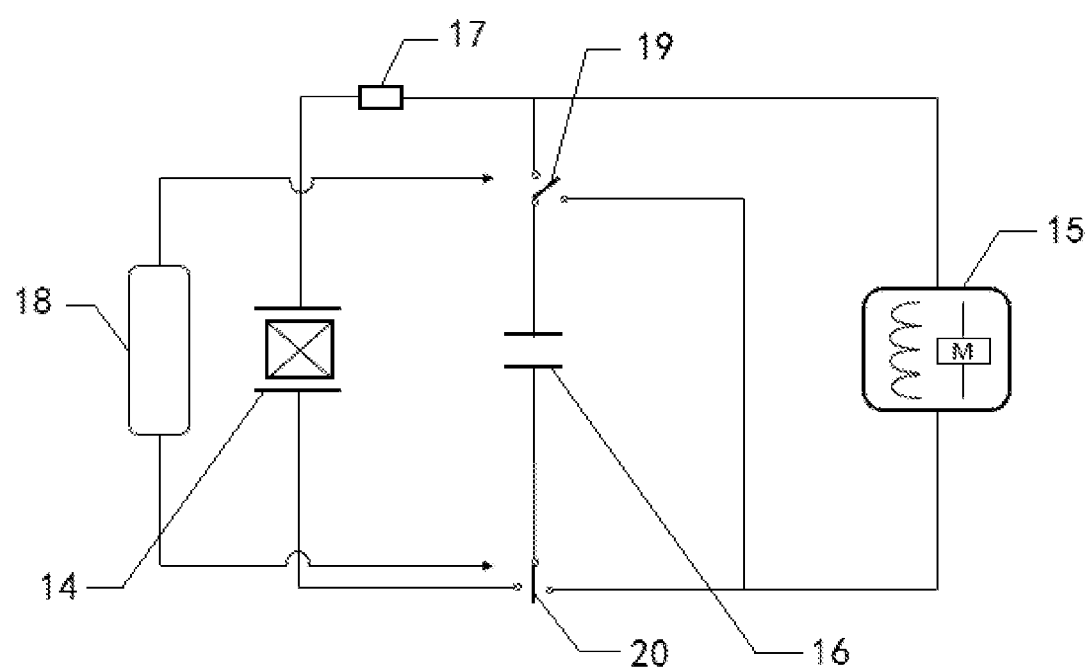
FIG. 9 is a schematic diagram of a circuit system in the present invention.
Figure 10:
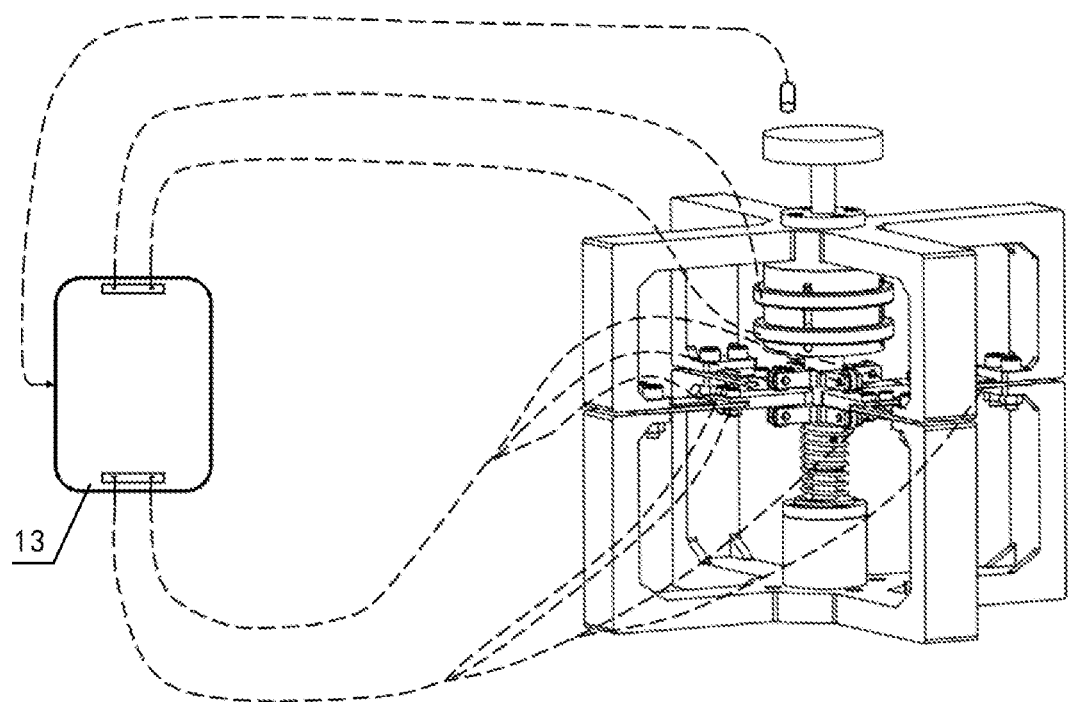
FIG. 10 is a schematic diagram of an electromagnetic-piezoelectric composite vibration control device based on the synchronized switch damping technology provided by the present invention.

As shown in FIG. 9, the figure is a schematic diagram of the circuit system, a plurality of piezoelectric plates 73 are connected in parallel to form a piezoelectric element 14, the two coils 52 are connected in series to form an inductive element 15, the circuit system 13 includes a regulating resistor 17, a super-capacitor 16, a first electronic switch 19, a second electronic switch 20 and an inductive circuit 18, the inductive circuit 18 is used for detecting the motion state of the system so that the on-off states of the first electronic switch and the second electronic switch 20 are changed according to requirements, and when the inductive circuit 18 detects that the load platform 1 reaches a static balance position, a loop is formed by the inductive element 15 and the super-capacitor 16 by switching the on-off states of the first electronic switch 19 and the second electronic switch 20; when the inductive circuit 18 detects that the load platform 1 reaches a vibration peak value, the piezoelectric element 14, the regulating resistor 17, the inductive element 15 and the super-capacitor 16 are connected in series in sequence to form a closed loop by switching the on-off states of the first electronic switch 19 and the second electronic switch 20.

Figure 11:
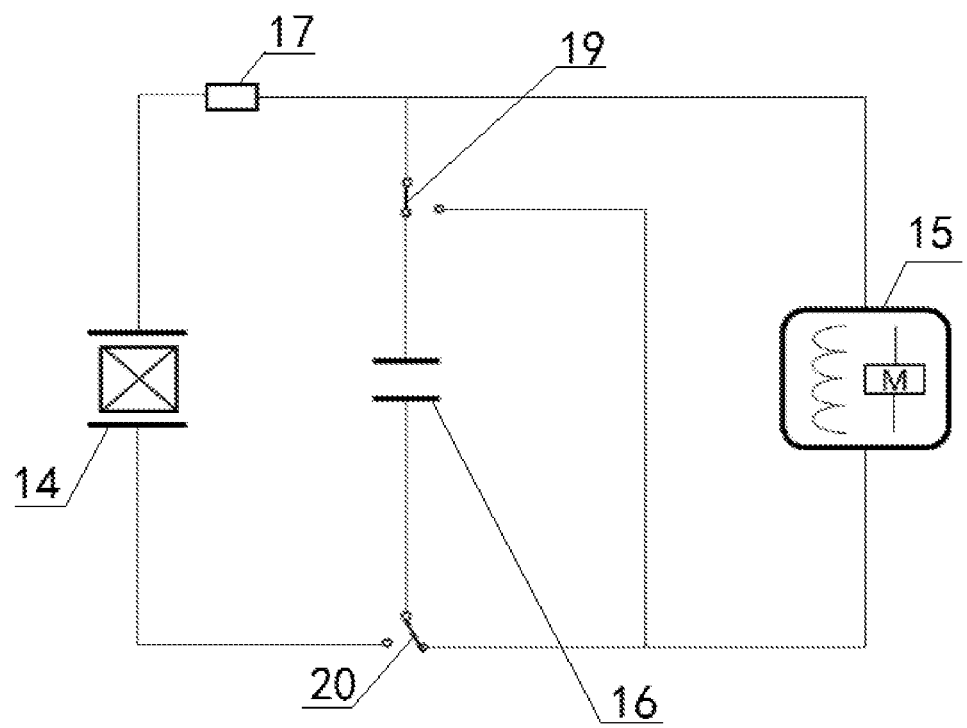
FIG. 11 is a connection diagram of the circuit in the electromagnetism and electricity capturing stage in the present invention.
Figure 12:
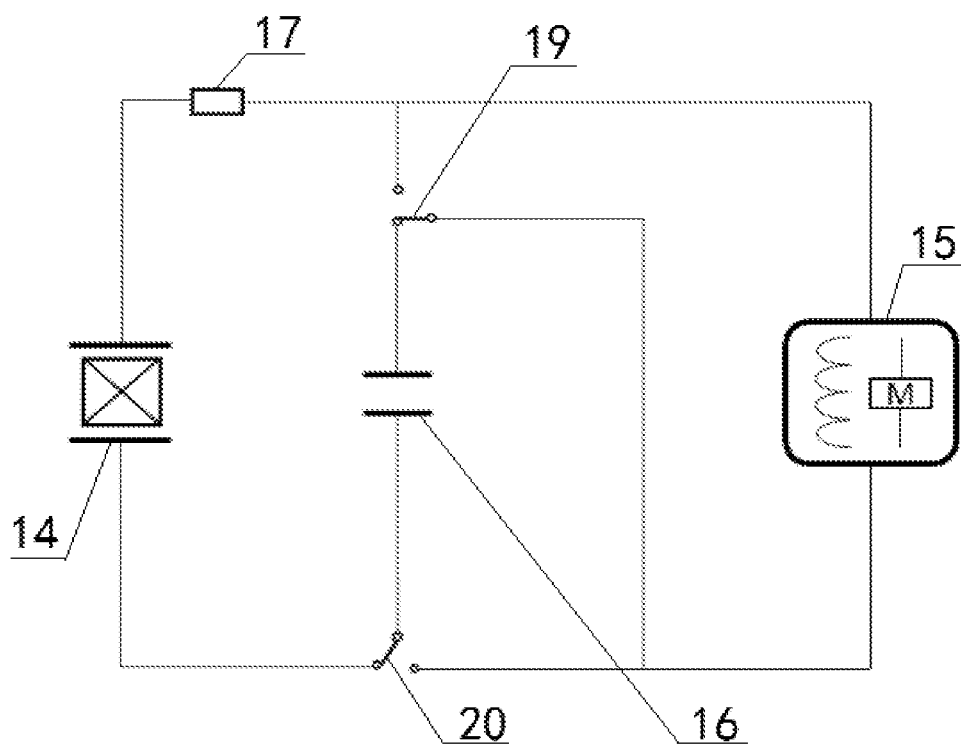
FIG. 12 is a connection diagram of the circuit in the piezoelectric vibration control stage in the present invention.

As shown in FIG. 9 to FIG. 12, the semi-active control process of the electromagnetic-piezoelectric composite vibration control device in the embodiment is further described in combination with the schematic diagram of the circuit system:

Initially, the system circuit is as shown in FIG. 9, and the first electronic switch 19 and the second electronic switch 20 are switched off completely. The load platform 1 in the device is forced to vibrate under external excitation, and reaches a stable state. When the inductive circuit 18 detects that the load platform 1 reaches the static balance position, the load platform 1 is in a state as shown in FIG. 11 by switching the first electronic switch 19 and the second electronic switch 20 inside the circuit, right now, a loop is formed by the inductive element 15 and the super-capacitor 16 only, the maximum electricity obtained by the electromagnetic mechanism 5 can be stored inside the super-capacitor 16, when the storage is completed, the first electronic switch 19 and the second electronic switch 20 are switched off again to an initial state, electromagnetic energy harvesting in the first stage is completed, and a self-adaptive voltage source is provided for the next stage; when the inductive circuit 18 detects that the load platform 1 reaches vibration peak values (maximum value and minimal value), the first electronic switch 19 and the second electronic switch 20 inside the circuit are switched so that the circuit is in the state as shown in FIG. 12, right now, the piezoelectric element 14, the regulating resistor 17, the inductive element 15 and the super-capacitor 16 are connected in series to form a closed loop, due to the fact that the movement speed of the permanent magnet 53 of the electromagnetic mechanism 5 is zero right now, the induced voltage is fundamentally zero, and the inductive element 15 can be regarded as an inductor for regulating the circuit right now, so that the problem that the circuit system 13 needs high inductance can be solved, the super-capacitor 16 serves as an external power supply right now, damping control of a self-adaptive piezoelectric synchronized switch in the second stage is completed, and then the first electronic switch 19 and the second electronic switch 20 are switched off to complete vibration control in one cycle. The generated induced voltage is different in polarity due to the difference of the motion direction of the permanent magnet 53, the direction of force generated when the voltage acts on the piezoelectric element 14 can be opposite to the vibration direction all the time through reasonable configuration, so that a damping effect is generated.

Figure 13:
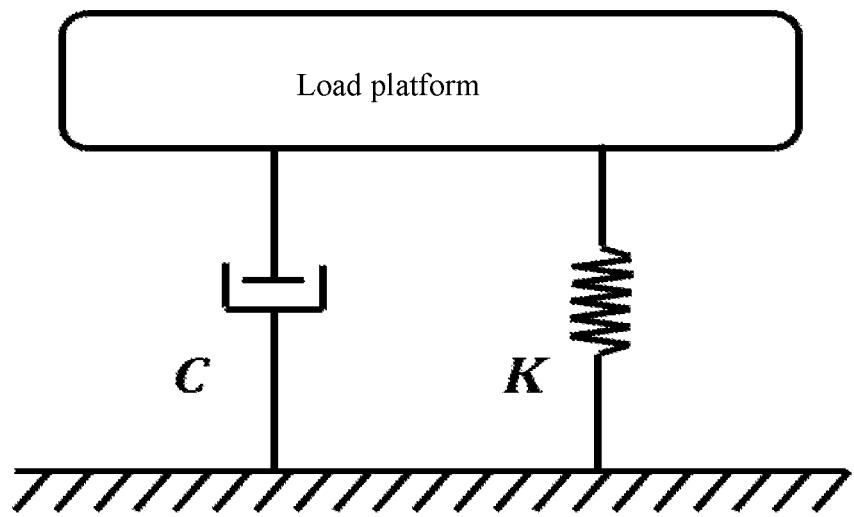
FIG. 13 is a passive vibration damping principle schematic diagram of an electromagnetic-piezoelectric composite vibration control device based on the synchronized switch damping technology provided by the present invention.

The passive vibration damping, electromagnetic semi-active vibration damping and electromagnetic-piezoelectric composite semi-active vibration damping principles in the embodiment are contrasted as follows:

As shown in FIG. 13, passive vibration damping of the device in the embodiment indicates that the circuit system 13 does not work and vibration damping is realized by a mechanical structure completely. A vibration damping mechanism is equivalent to the inherent spring-mass-damping unit vibration system of the system, and the transmissibility curve function G is as follows:

$$G = \frac{x_1}{x_0} = \frac{Cs + K}{Ms^2 + Cs + K};$$

In the formula, $x_1$ is the vibration displacement of the load platform 1, $x_0$ is shock excitation amplitude, C is the equivalent damping of the system, K is the equivalent stiffness of the system, M is the mass of the load platform 1, s=jω is the complex variable of Laplace transform, and ω is a frequency domain coefficient.

Figure 14:
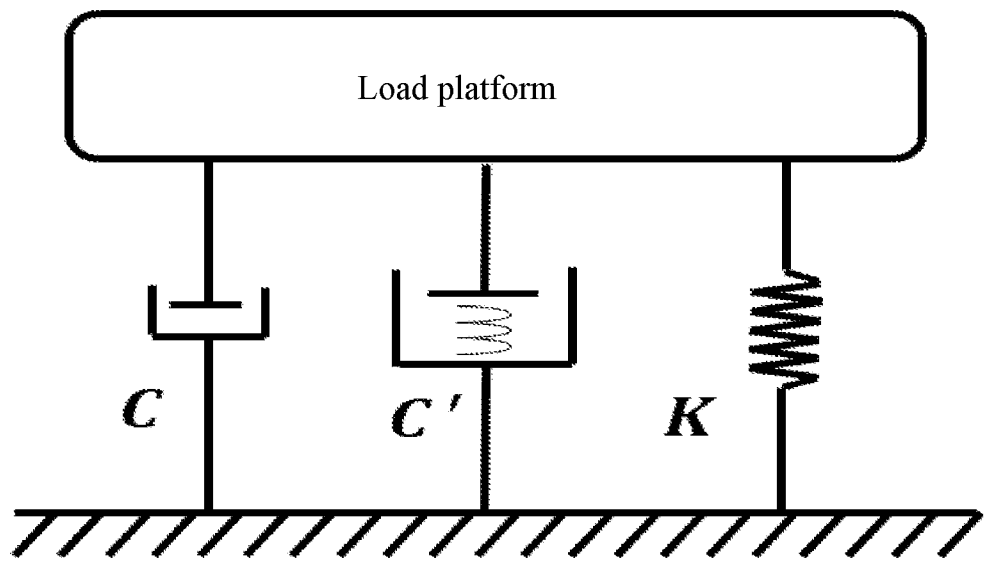
FIG. 14 is an electromagnetic semi-active vibration damping principle schematic diagram of an electromagnetic-piezoelectric composite vibration control device based on the synchronized switch damping technology provided by the present invention.

As shown in FIG. 14, electromagnetic semi-active vibration damping of the device in the embodiment indicates that the first stage of vibration control of the system is implemented only, namely electromagnetic energy is captured, equivalently, an electromagnetic damping element is added additionally, and the corresponding transmissibility curve function G0 is as follows:

$$G_0 = \frac{x_2}{x_0} = \frac{C_0 s + K}{Ms^2 + C_0 s + K}, \quad C_0 = C + C';$$

In the formula, $x_2$ is the vibration displacement of the load platform 1, under electromagnetic semi-active vibration damping, of the device in the embodiment, $C_0$ is the equivalent damping of the system in the condition, and C' is additional equivalent electromagnetic damping.

Figure 15:
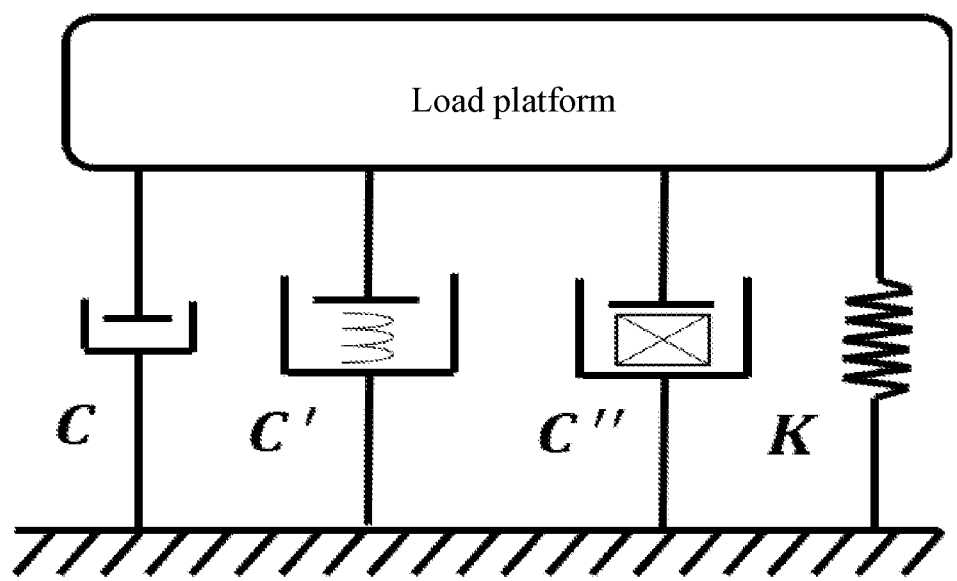
FIG. 15 is an electromagnetic-piezoelectric composite semi-active vibration damping principle schematic diagram of the electromagnetic-piezoelectric composite vibration control device based on the synchronized switch damping technology provided by the present invention.

As shown in FIG. 15, the schematic diagram of electromagnetic-piezoelectric composite semi-active vibration damping of the device in the embodiment is equivalent to that a piezoelectric damping element is additionally added on the basis of FIG. 14 afterwards, and the corresponding transmissibility curve function G1 is as follows:

$$G_1 = \frac{x_3}{x_0} = \frac{C_1 s + K}{Ms^2 + C_1 s + K}, \quad C_1 = C_0 + C'';$$

In the formula, $x_3$ is the vibration displacement of the load platform 1, under electromagnetic-piezoelectric composite semi-active vibration damping, of the device in the embodiment, $C_1$ is the equivalent damping of the system in the condition, and C" is additional equivalent damping.

Figure 16:
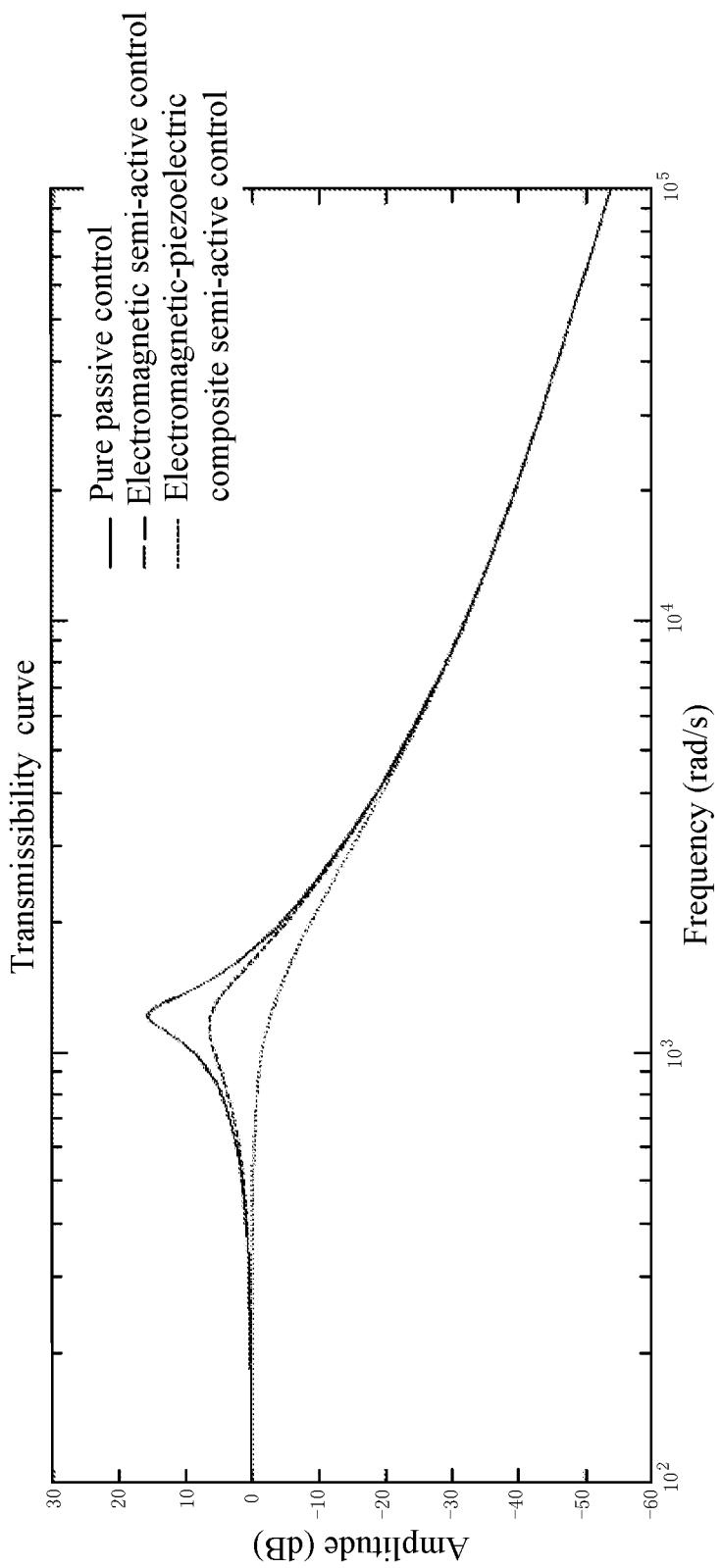
FIG. 16 is a transmissibility curve comparison diagram under three conditions in FIG. 13 to FIG. 15.

FIG. 16 is a transmissibility curve diagram under three conditions in FIG. 13 to FIG. 15. It is observed that the transmissibility of the system is of a higher peak value at the positions of resonance peaks under passive vibration damping condition from full lines in the figures. It is observed that the resonance peak value of the system is obviously improved due to an electromagnetic damping effect after electromagnetic semi-active control is adopted from imaginary lines in the figures. It is observed that the damping of the system is further strengthened due to the piezoelectric damping effect after electromagnetic piezoelectric composite semi-active vibration damping is adopted from dotted lines in the figures, and it is observed that the resonance peak value of the system is further improved from the transmissibility curve of the system.

In summary, the electromagnetic-piezoelectric composite vibration control device based on the synchronized switch damping technology provided by the present invention includes an electromagnetic mechanism 5, piezoelectric cantilever beams 7 and a circuit system 13, due to the structural advantages of the device, the circuit system 13 is greatly simplified, the reliability of the whole system is strengthened, even if the circuit system 13 breaks down, due to the rigidity damping characteristic of the electromagnetic mechanism 5 and the piezoelectric cantilever beams 7, a preferable damping effect also can be realized, and the circuit system is simple in structure and reliable in performance; the electromagnetic mechanism 5 is used for storing electricity generated by electromagnetic induction into the circuit system 13 to serve as a voltage source, and a voltage source does not need to be provided externally; the induced voltage generated by the electromagnetic mechanism 5 is approximately of a proportional relation with the maximum amplitude of system vibration, and thus the system is of a self-adaptive voltage source characteristic; due to the fact that switching is carried out to implement piezoelectric vibration control when the vibration amplitude of the system is maximum, the speed of the permanent magnet 53 of the electromagnetic mechanism 5 is zero right now, the induced voltage of the coils 52 is zero, the inductive element can be regarded as an inductor for regulating the circuit right now, and a large inductive element does not need to be additionally added to the circuit system 13.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the present invention.

What is claimed is:

1. An electromagnetic-piezoelectric composite vibration control device based on a synchronized switch damping technology, wherein the electromagnetic-piezoelectric composite vibration control device comprises a load platform, a guide rod, an upper rigid frame, a lower rigid frame, an upper guiding component, a lower guiding component, an upper idler wheel mechanism, a lower idler wheel mechanism, an elastic component, an electromagnetic mechanism, a circuit system and a plurality of piezoelectric cantilever beams, the upper rigid frame is arranged at an upper part of the lower rigid frame, the upper guiding component is installed inside the upper rigid frame, the lower guiding component is installed inside the lower rigid frame, the guide rod is nested inside the upper guiding component and the lower guiding component, the load platform is fixed to an upper end of the guide rod, the upper idler wheel mechanism and the lower idler wheel mechanism are fixedly sleeved on the guide rod and are positioned between the upper guiding component and the lower guiding component respectively, the electromagnetic mechanism is fixedly sleeved outside the guide rod, the elastic component is sleeved outside the lower idler wheel mechanism, one end of each piezoelectric cantilever beam is fixed between the upper rigid frame and the lower rigid frame, an other end of each piezoelectric cantilever beam is arranged between the upper idler wheel mechanism and the lower idler wheel mechanism, and the plurality of piezoelectric cantilever beams and the electromagnetic mechanism are connected with the circuit system respectively;

wherein each piezoelectric cantilever beam comprises a piezoelectric plate, and the electromagnetic mechanism comprises two coils; a plurality of piezoelectric plates are connected in parallel to form a piezoelectric element, the two coils are connected in series to form an inductive element, the circuit system comprises a regulating resistor, a super-capacitor, a first electronic switch, a second electronic switch and an inductive circuit, the inductive circuit is used for detecting a motion state of a system so that on-off states of the first electronic switch and the second electronic switch are changed according to requirements, and when the inductive circuit detects that the load platform reaches a static balance position, a loop is formed by the inductive element and the super-capacitor by switching on-off states of the first electronic switch and the second electronic switch; when the inductive circuit detects that the load platform reaches a vibration peak value, the piezoelectric element, the regulating resistor, the inductive element and the super-capacitor are connected in series in sequence to form a closed loop by switching on-off states of the first electronic switch and the second electronic switch.

2. The electromagnetic-piezoelectric composite vibration control device based on the synchronized switch damping technology according to claim 1, wherein the electromagnetic-piezoelectric composite vibration control device further comprises a gasket, the gasket is sleeved on the guide rod, and the gasket is positioned between the lower guiding component and a lower elastic component.

3. The electromagnetic-piezoelectric composite vibration control device based on the synchronized switch damping technology according to claim 1, wherein each piezoelectric cantilever beam comprises a flexible plate and a rigid plate, one end of each flexible plate is fixed between the upper rigid frame and the lower rigid frame, the other end of each flexible plate is fixedly connected with a corresponding rigid plate, a plurality of rigid plates are arranged between the upper idler wheel mechanism and the lower idler wheel mechanism, and each piezoelectric plate is pasted onto a corresponding flexible plate.

4. The electromagnetic-piezoelectric composite vibration control device based on the synchronized switch damping technology according to claim 3, wherein the upper idler wheel mechanism comprises an upper idler wheel support, a plurality of upper wheel axles and a plurality of upper idler wheels, the upper idler wheel support comprises an upper cylinder and a plurality of upper supports, the upper idler wheel support is of an integral structure, the upper cylinder is fixedly sleeved on the guide rod, one end of each upper support is arranged at a lower part of the upper cylinder, a corresponding upper wheel axle is installed at the other end of each upper support, a corresponding upper idler wheel is installed on each upper wheel axle, and each upper idler wheel is in contact with an upper surface of a corresponding rigid plate; the lower idler wheel mechanism comprises a lower idler wheel support, a plurality of lower wheel axles and a plurality of lower idler wheels, the lower idler wheel support comprises a lower cylinder and a plurality of lower supports, the lower idler wheel support is of an integral structure, the lower cylinder is fixedly sleeved on the guide rod, one end of each lower support is arranged at an upper part of the lower cylinder, a corresponding lower wheel axle is installed at Mean other end of each lower support, a corresponding lower idler wheel is installed on each lower wheel axle, and each lower idler wheel is in contact with a lower surface of a corresponding rigid plate.

5. The electromagnetic-piezoelectric composite vibration control device based on the synchronized switch damping technology according to claim 4, wherein the electromagnetic mechanism comprises a plastic fixed support, a locking ring and a permanent magnet, wherein the permanent magnet and the locking ring are arranged on the guide rod, the locking ring, the permanent magnet and the upper idler wheel support are arranged from top to bottom in sequence, the plastic fixed support is fixed on the upper rigid frame, the plastic fixed support is arranged outside the permanent magnet in a covering mode, and the two coils are sleeved outside the plastic fixed support respectively.

6. The electromagnetic-piezoelectric composite vibration control device based on the synchronized switch damping technology according to claim 5, wherein the plastic fixed support is in a shape of a cylinder, a plurality of vertical sliding grooves are formed in a circumferential direction of the plastic fixed support, the two coils are sleeved outside the plastic fixed support, and the two coils are fixed onto the plastic fixed support by setting fixed bolts inside the plurality of vertical sliding grooves.

7. The electromagnetic-piezoelectric composite vibration control device based on the synchronized switch damping technology according to claim 1, wherein the upper guiding component and the lower guiding component are linear bearings respectively.

8. The electromagnetic-piezoelectric composite vibration control device based on the synchronized switch damping technology according to claim 1, wherein an upper elastic component is a reset spring.

* * * * *